United States Patent
Ramakrishna et al.

(10) Patent No.: US 11,714,935 B2
(45) Date of Patent: Aug. 1, 2023

(54) METHOD, APPARATUS, SYSTEM AND COMPUTER PROGRAM PRODUCT FOR SELECTING A FILTER FOR A FILTRATION PROCESS

(71) Applicant: Global Life Sciences Solutions USA LLC, Marlborough, MA (US)

(72) Inventors: Manoj Kumar Ramakrishna, Karnataka (IN); Swapnil Puranik, Karnataka (IN); Mohammed Mehtab Khan, Karnataka (IN)

(73) Assignee: GLOBAL LIFE SCIENCES SOLUTIONS USA LLC, Marlborough, MA (US)

( * ) Notice: Subject to any disclaimer, the term of this patent is extended or adjusted under 35 U.S.C. 154(b) by 330 days.

(21) Appl. No.: 16/955,879

(22) PCT Filed: Dec. 17, 2018

(86) PCT No.: PCT/EP2018/085322
§ 371 (c)(1),
(2) Date: Jun. 19, 2020

(87) PCT Pub. No.: WO2019/121573
PCT Pub. Date: Jun. 27, 2019

(65) Prior Publication Data
US 2021/0073439 A1    Mar. 11, 2021

(30) Foreign Application Priority Data
Dec. 22, 2017   (IN) .............................. 201741046239

(51) Int. Cl.
*G06F 30/20* (2020.01)
*B01D 63/08* (2006.01)

(52) U.S. Cl.
CPC ........... *G06F 30/20* (2020.01); *B01D 63/084* (2013.01)

(58) Field of Classification Search
CPC ....... G06F 30/20; G06F 30/23; B01D 63/084; B01D 63/08
See application file for complete search history.

(56) References Cited

FOREIGN PATENT DOCUMENTS

| JP | 2005-128788 A | 5/2005 |
| JP | 2015-197783 A | 11/2015 |
| JP | 2016-193421 A | 11/2016 |

OTHER PUBLICATIONS

Tarleton et al. "Solid/Liquid Separation", Butterworth-Heinemann, 2007, ISBN 9781856174213. 140 Pages. (Year: 2007).*

(Continued)

*Primary Examiner* — Eunhee Kim
(74) *Attorney, Agent, or Firm* — Eversheds Sutherland (US) LLP

(57) ABSTRACT

Methods for selecting a filter for a filtration process are described. Input data is received, and based on the input data, one or more filter characteristics for each of a plurality of filter candidates for a filtration process are identified. Process parameters of the filtration process are identified. A computer-implemented simulation process of the filtration process for each of the plurality of filter candidates is performed, based on the identified process parameters and identified filter characteristics. One or more output characteristics of the filtration process are determined based on the simulation. A filter candidate of the plurality of filter candidates is selected based on the one or more output characteristics.

18 Claims, 4 Drawing Sheets

(56) References Cited

OTHER PUBLICATIONS

Tarleton. Equipment selection and process design forsolid/liquid separation. IN: Proceedings of Filtech 2011. International Conference and Exhibition for F&S Technology, Wiesbaden, Germany, Mar. 22-24, 20 Pages. (Year: 2011).*
PCT International Search Report and Written Opinion for PCT Application No. PCT/EP2018/05322 dated Jun. 5, 2019 (13 pages).
Holdich, "Solid-Liquid Separation Equipment Selection and Modelling," Mineral Engineering, 2003, 16(2):75-83.
Tarleton et al., "Chapter 5—Selection, Data Analysis and Simulation by Computer Software," Solid Liquid Separation, 2007, pp. 201-255, XP040426293.
Bhatia, S. et al., "Performance prediction of membrane modules incorporating the effects of suction in the mass transfer coefficient under turbulent flow conditions," Separation and Purification Technology, 2007, 55: 182-190.
European Office Action for EP Application No. 18827025.0 dated Jun. 15, 2022 (11 pages).
Rajbzadeh, A.R. et al., "Fouling behavior of electroacidified soy protein extracts during cross-flow ultrafiltration using dynamic reversible-irreversible fouling resistances and CFD modeling," Journal of Membrane Science, 2010, 361: 191-205.
Office Action Issued in Japanese Patent Application No. 2020-534403, dated Dec. 5, 2022 with English Summary (8 Pages).

* cited by examiner

METHOD, APPARATUS, SYSTEM AND COMPUTER PROGRAM PRODUCT FOR SELECTING A FILTER FOR A FILTRATION PROCESS

CROSS REFERENCE TO RELATED APPLICATIONS

This application claims the priority benefit of PCT/EP2018/085322 filed on Dec. 17, 2018, which claims priority benefit of Indian Patent Application No. 201741046239 filed on Dec. 22, 2017, the entire contents of which are hereby incorporated by reference herein.

BACKGROUND

Filtration processes are used in many industries, including biotechnological, pharmaceutical and food-related industries, for example, to separate different components of substances. Types of filtration processes include dead-end filtration and cross-flow filtration. In dead-end filtration a fluid (known as the "feed") is passed through a filter typically including a membrane, trapping certain solids or particles at the filter, while the remaining fluid (known as the "permeate" or "filtrate") passes through the filter. In cross-flow filtration (also known as "tangential flow filtration"), the feed principally travels tangentially along the surface of the filter. A pressure difference is provided across the filter (known as "trans-membrane pressure (TMP)") so that the feed side is at a positive pressure relative to the opposite side (known as the permeate side). This causes a proportion of the material (material having dimensions smaller than the pore size) to pass through the filter. Fluid which does not pass through the membrane (known as the "retentate") is typically returned to a feed reservoir or other receptacle from where it may be recycled in further passes across the membrane.

The characteristics of the filter are an important factor in designing and implementing such filtration processes. Factors such as pore size and filter dimensions affect suitability of the filter for a given process, and also factors such as the time required to yield a given quantity of the required product.

DETAILED DESCRIPTION

Figure 1:
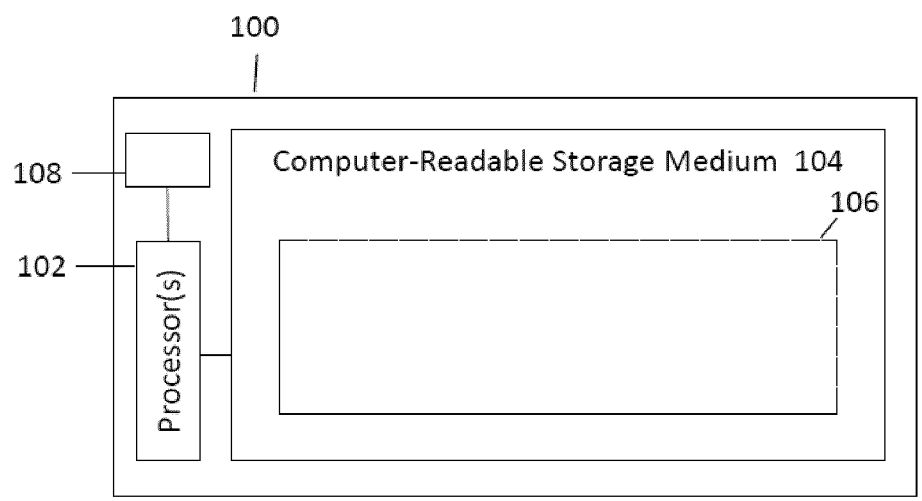
FIG. 1 shows schematically an example simulation apparatus according to an example.

FIG. 1 shows an apparatus, hereinafter simulation apparatus 100, in the form of a computerised device, configured to perform a simulation process according to an example. The simulation apparatus 100 comprises at least one processor 102, communicatively coupled to a non-transitory computer-readable storage medium 104 comprising a set of computer-readable instructions 106 stored thereon. The set of computer-readable instructions 106 may be executed by the at least one processor 450 to cause the at least one processor 102 to perform a method according to any of the examples described herein. The simulation apparatus 100 may also comprise an interface 108. The interface 108 may comprise a user interface, such as, for example, a keyboard, mouse, touch screen or other input device. Alternatively or additionally, the interface 108 may comprise a communications interface, for communicating with a user or other entity remotely, via wired or wireless communication, via the Internet, for example.

The at least one processor 102 may include a microprocessor, microcontroller, processor module or subsystem, programmable integrated circuit, programmable gate array, or another control or computing device. The computer-readable storage medium 104 may be implemented as one or multiple computer-readable storage media. The computer-readable storage medium 104 can include different forms of memory, including semiconductor memory devices such as dynamic or static random access memory modules (DRAMs or SRAMs), erasable and programmable read-only memory modules (EPROMs), electrically erasable and programmable read-only memory modules (EEPROMs) and flash memory; magnetic disks such as fixed, floppy and removable disks; other magnetic media including tape; optical media such as compact disks (CDs) or digital video disks (DVDs); or other types of storage devices. The computer-readable instructions 106 can be stored on one computer-readable storage medium, or alternatively, can be stored on multiple computer-readable storage media.

Figure 2:
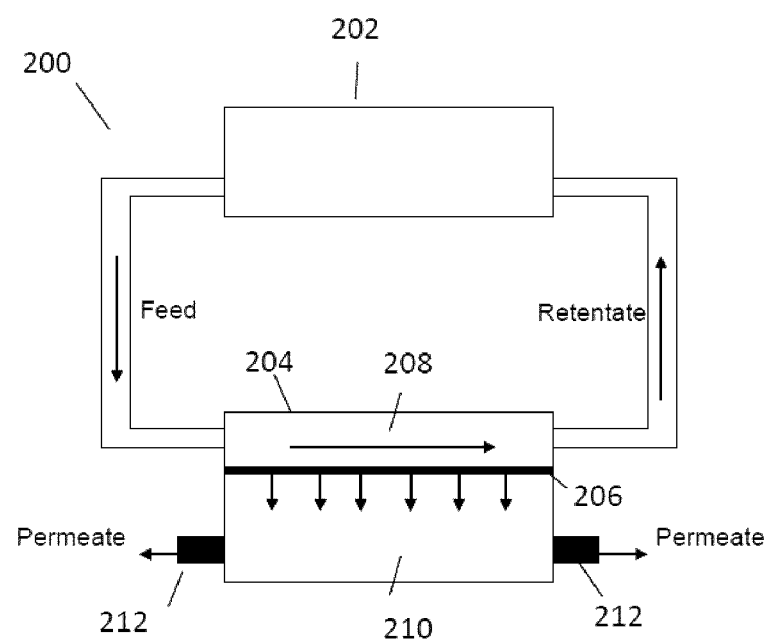
FIG. 2 shows schematically an example filtration system in which a filtration process to be simulated according to an example may be executed.

FIG. 2 schematically shows an example filtration system 200 in which a filtration process to be simulated according to an example may be executed. The example filtration system 200 of FIG. 2 is for running a cross-flow filtration process.

The filtration system 200 includes a feed reservoir 202 and a filter device 204, the filter device 204 including a membrane 206 and a filter channel 208. A feed, in the form of a fluid, is passed from the feed reservoir 202 to a first end of the filter channel 208. The feed then flows through the filter channel 208 across the surface of the filter membrane 206. A pressure difference across the membrane 206 causes some components (the permeate), e.g. those that have dimensions smaller than pores in the membrane 204, to pass through the membrane 206 to a permeate side 210 of the filter device 204. In the example shown, the permeate flows out of the filter device 204 through exit conduits 212, from where it may be collected, for example. Components that do not pass through the membrane (the retentate) are fed back to the feed reservoir 202. The retentate may be reused as feed during a further filtration cycle.

Examples of filter devices 204 that may be used in the system 200 of FIG. 2 include cartridge filters and cassette filters. In cartridge filters, also known as hollow fibre filters, the membrane comprises a set of parallel hollow fibres. The feed passes through the lumen of the fibres, and the permeate passes through the fibres and may be collected from the outside of the set of fibres. Cassette filters include a housing holding multiple (typically flat) sheets of membrane, which are held apart from one another and from one another by support screens. The feed passes between the sheets of membrane. The permeate passes through the sheets and may be collected from a side of the sheets opposite to that along which the feed passes.

Filtrations processes such as that illustrated in FIG. 2 may be used for many different purposes, including biotechnological, pharmaceutical, petrochemical and food technological purposes, for example. Biotechnological processes for which the system 200 may be used include cell harvesting, cell or lysate classification, protein fractionation and concentration and diafiltration processes. It should be noted that in some cases, the object of the filtration is to obtain the permeate i.e. the permeate is the desired product which is put to further use, whereas in other cases the desired product is the retentate, or both the retentate and the permeate.

Figure 3:
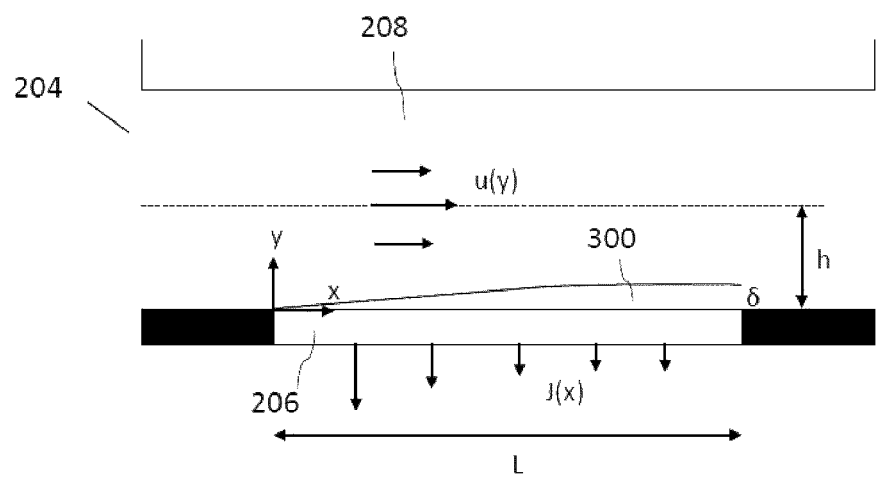
FIG. 3 shows schematically a filter device in use.

FIG. 3 illustrates an example of a filter device 204 in use. The filter device 204 includes a filter channel 208 of half-height h, through which feed flows at a rate u(y) across the surface of a filter membrane 206 of length L. A layer 300 of solidified solutes (often referred to as a "cake" or "gel" layer) is formed on the surface of the membrane 206, whose thickness 6 may vary along the length of the membrane 206.

The permeate flux J(x) (the volume of permeate flowing through the membrane 206 per unit area per unit time) may vary along the length of the membrane 206, due to the effect of the gel layer 300, for example.

Figure 4:
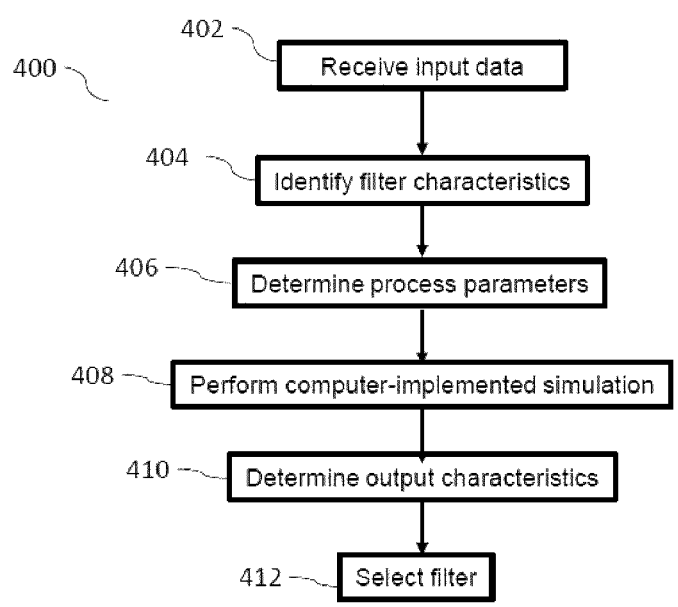
FIG. 4 is a flow diagram illustrating a method for selecting a filter device according to an example.

FIG. 4 is a flow diagram illustrating a method 400 of selecting a filter device for a filtration process in accordance with an example.

At 402, the simulation apparatus 100 receives input data via the interface 108. At 404 the simulation apparatus 100 identifies, based on the received input data one or more filter characteristics for each of a plurality of filter characteristics for a filtration process, such as the process described above in relation to FIG. 2.

Examples of the filter characteristics include geometric properties of the filter, such as a length of the membrane 206 over which the feed passes, a membrane area and a height or half-height of the channel that the feed passes through as it passes over the membrane 206, and membrane properties, such as porosity. In one example, the input data comprises values of these characteristics, i.e. the filter characteristics are received directly via the interface 108, from a user, for example. In another example, the input data identifies multiple filter candidates to the simulation apparatus 100, by providing respective filter identifiers of the filter candidates, for example. In this case, the simulation apparatus 100 may retrieve data from a data store storing associations between the filter identifiers and filter characteristics of those filters, in the form of a look-up table (not shown) for example. The data store storing the associations may be the computer-readable storage medium 104 illustrated in FIG. 1, or it may be a remote data store accessed via the interface 108, such as a data store on a server device, for example.

At 406, the simulation apparatus 100 identifies process parameters of the filtration process i.e. parameters of the filtration process according to which the simulation is to be run. The process parameters may include, for example, a combination of: a type of filtration process (e.g. cross-flow filtration or dead-end filtration), a partition coefficient, an initial feed volume, an initial feed composition, an initial feed viscosity, an initial feed concentration, an initial feed temperature, an initial feed solubility, and an initial hydraulic permeability, for example. Values for these parameters may be received from a user via the interface 108 for example, or an identifier or a process or type of process may be received via the interface 108, and the parameters determined by retrieving data based on the identifier, similar to as described above in relation to the filter characteristics.

At 408, the simulation apparatus 100 performs a computer-implemented simulation process of the filtration process, for each of the plurality of filter candidates, based on the identified filter characteristics and identified process parameters. Example simulations are described in detail below.

At 410, the simulation apparatus 100 determines output characteristics of the filtration process, on the basis of the simulation. For example, the simulation apparatus 100 may determine one or more of: a permeate volume, a permeate composition, a permeate viscosity, a retentate volume, a retentate composition a retentate viscosity, and characteristics relating to the formation of a "cake" layer, such as its effect on the hydraulic permeability of the membrane 206. The output characteristics may be output as static quantities (for example an amount of output after a certain time period). Alternatively or additionally the output may present the time variation of one or more of the output characteristics. For example, one or more of the output characteristics may be presented as a graph showing a variation of the characteristic with time.

At 412, a filter candidate of the plurality of filter candidates is selected based on the one or more output characteristics. In some examples, the simulation apparatus 100 may perform the selection based on the determined output characteristics, and provide an indication of same to the user; for example, an identifier of the selected filter may be shown on a screen (not shown) of the simulation apparatus 100. For example, the simulation apparatus 100 may compare the determined output characteristics with desired output characteristics, which may have been input by a user via the interface 108 for example, and select a candidate filter which results in output characteristics more closely aligned to the desired output characteristics than other candidate filters. In some examples, the simulation apparatus 100 additionally or alternatively provides data indicating the determined output characteristics to the user, via a screen (not shown), for example, and the user may make the selection on the basis of the provided data.

The computer-implemented simulation mention above may be based on models of fluid mechanics using e.g. the Navier-Stokes Equation to model flow within the channel and the Brinkman Equations for flow within the membrane 206. Solutions of the equations used to model the flow may then be solved in order to determine the output characteristics. In one example, the simulation apparatus 100 may use a finite element solving program such as COMSOL™ to model the filtration process.

In some examples, the computer implemented simulation process comprises a first simulation stage, comprising determining one or more static process characteristics of the filtration process, and a second simulation stage, comprising determining one or more dynamic process characteristics of the filtration process, based at least in part on the determined one or more static process characteristics.

Examples of equations and algorithmic processes that may be used in the simulation process are described below in the section titled "Example Algorithms".

The processes described above provide an automated method for selection of a filter for a filtration process. Prior art methods may involve a process operator selecting a filter based on his or her knowledge of filters which are likely to work for a given filtration process, and trial-and-error using filters on test systems. However, these methods may be time consuming and expensive. In contrast, the processes described above enable a filter suitable for a given filtration process to be selected without the time and expense required for such testing, and without any requirement for specialist knowledge.

Further, once a filter has been selected, simulation processes as described herein may be used to improve or optimise the filtration process running with the selected filter. For example, once a filter candidate has been selected (either automatically, or by manual input, as described above), further iterations of the simulation process may be performed with different process parameters to improve the output characteristics according to criteria, which may be set by user input, for example. For example, the simulation apparatus 100 may provide an indication of a recommended parameter, such as a TMP, or advisory information, such as an expected time to reach a desired product concentration, or a time or number of cycles after which the filter device should be changed, or the like.

Thus, examples described herein may be used in the design and/or development of filtration processes, for example in setting or updating standard operating procedures. In some examples, the simulation apparatus 100 may be used in conjunction with an actual (i.e. non-simulated) filtration process, as is now described with reference to FIG. 5.

Figure 5:
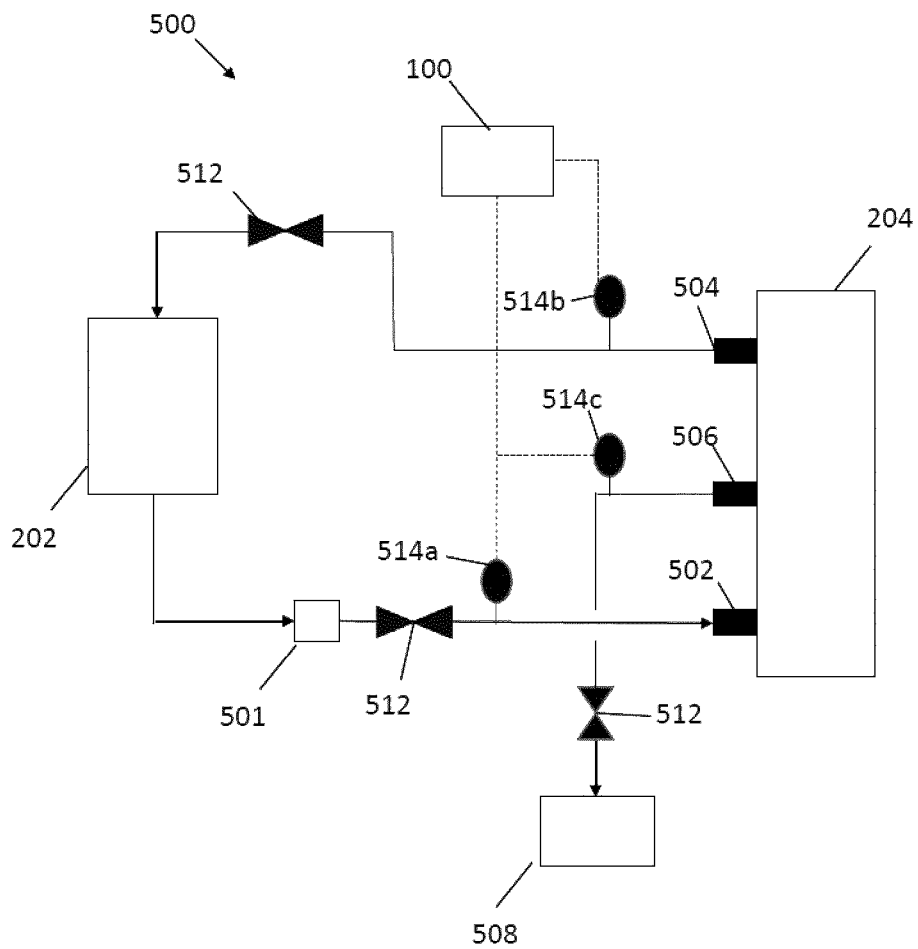
FIG. 5 is a schematic diagram showing a simulation apparatus and a filtration system according to an example.

FIG. 5 schematically illustrates a system including a filtration system 500 and the simulation apparatus 100. The filtration system 500 is for executing a filtration process; in the present example, the filtration system 500 is for executing a cross-flow filtration process.

The physical filtration system 500 includes a feed reservoir 202 and a filter device 204, corresponding to the feed reservoir and filter device described above with reference to FIG. 2. The physical filtration system 500 includes a feed pump 501 which drives the feed into the filter device 204 via a feed conduit 502. The retentate exits the filter via a retentate conduit and 504 and returns to the reservoir 202. The permeate, having passed through a membrane (not shown) of the filter device 204, exits the filter device 204 via a permeate conduit 506, and is collected in a collection vessel 508. The physical filtration system 500 also includes valves 512 to regulate flow within the system 500.

In accordance with examples, the physical filtration system 500 includes sensors 514a, 514b, 514c to measure one or more characteristics of the filtration process. In the example shown, the physical filtration system 500 includes a feed sensor 514a, a retentate sensor 514b and a permeate sensor 514c, configured to measure one or more characteristics of the feed, retentate and permeate, respectively. The characteristics to be measured may include one or more of a temperature, a pressure, a flow rate and a concentration, for example.

The sensors 514a, 514b, 514c are configured to communicate with the simulation apparatus 100 via wired or wireless connections, for example.

The simulation apparatus 100 may use data from the sensors 514a, 514b, 514c to alter parameters of a simulation of a filtration process corresponding to the filtration process run on the filtration system 500, the latter functioning as a test system. For example, where measured data received from one or more of the sensors 514a, 514b, 514c indicates a characteristic value deviating from an expected characteristic value determined by the simulation, one or more parameters of the simulation process may be updated to account for this. In some cases, when such a deviation is detected, the filtration process may be repeated (by e.g. replacing the filter device 204 and the feed) in order to ensure that the deviation is not due to a fault in the filtration system 500.

Figure 6:
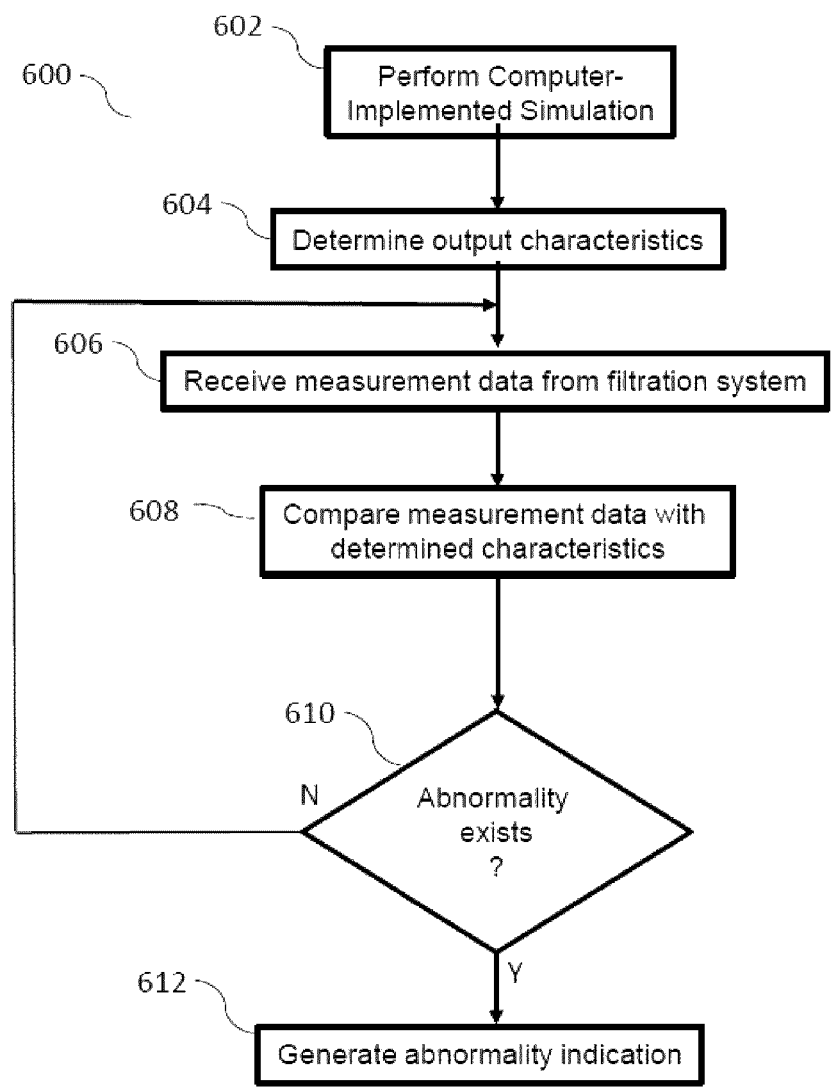
FIG. 6 is a flow diagram illustrating a method of monitoring a filtration process according to an example.

In other examples, the simulation apparatus 100 may use data received from the sensors 514a, 514b, 514c to monitor for an abnormality in the physical filtration system 500, as is now described with reference to FIG. 6, which is a flow diagram illustrating a method 600 of monitoring a filtration process in accordance with an example.

At 602, the simulation apparatus 100 performs a computer-implemented simulation of a filtration process corresponding to the physical filtration process executed by the physical filtration system 500. The simulation may correspond to a computer-simulated simulation processes as described above, for example. The simulation may be performed on the basis of input date, for example data input by a user, such as filter characteristic data, or process parameter data, as described above. Additionally, or alternatively, the simulation may be performed on measurement data received from one or more of the sensors 514a, 514b, 514c. For example, the sensors may provide data indicating one or more process parameters as indicated above, to form the basis of the simulation.

At 604, the simulation apparatus determines one or more time-varying characteristics of the simulated filtration process based on the simulation process. The one or more time-varying characteristics may comprise a concentration, for example a concentration or flow rate of the permeate, retentate or feed.

At 606, the simulation apparatus 100 receives measurement data from one or more of the sensors 514a, 514b, 514c. The measurement data indicates a value of the one or more time-varying characteristics at a given time. The given time may be based on a start time of the filtration process executed on the filtration system 500, for example. For example, the simulation apparatus 100 may receive an indication from a user via the interface 108 when the filtration process is starting, or it may detect a start time based on data received from one or more of the sensors 514a, 514b, 514c, for example.

At 608, the simulation apparatus 100 compares the measurement data received from the filtration system 500 with the determined one or more time-varying characteristics. This may comprise comparing a value of the or each characteristic indicated by measurement data with a value or values of the time varying characteristic determined during the computer implemented simulation process, for example. In other words, the simulation apparatus 100 may compare the value or values of the measurement data with an expected value or values of the respective characteristic at the given time, as determined by the simulation process.

At 610, the simulation apparatus 100 determines whether there is an abnormality in the filtration system 500, based on the comparison. For example, the simulation apparatus 100 may determine that an abnormality exists in the filtration system 500 if a value indicated by the measurement data differs from an expected value by more than a predetermined amount (e.g. by more than a predetermined absolute value, or by more than a predetermined proportion).

If the simulation apparatus 100 determines that an abnormality exists in the filtration system 500, the simulation apparatus 100 generates an abnormality indication at 612. The abnormality indication may be a visual indication, such as an alert message or "pop-up" on a screen of the simulation apparatus 100 for example, or it may be an audio or other alert. In some examples, the abnormality indication indicates information regarding the nature of the abnormality, for example an abnormal flow rate or concentration in one or more of the feed, permeate and the retentate. In other examples, the abnormality indication simply indicates that an abnormality exists without indicating further details.

If the simulation apparatus 100 does not determine an abnormality in the filtration system 500, the monitoring process returns to 606 and receives further measurement data from the filtration system 500.

The method of monitoring a filtration process described with reference to FIG. 6 may thus be used to provide warning to user e.g. an operator of the filtration system 500 that an abnormality (that is, a fault), exists in the filtration system 500, during a production process for example. This may enable the user to take corrective action, such as replacing a filter, against the abnormality. This in turn may improve efficiency or inhibit production of a defective product, for example.

Additionally or alternatively, the simulation apparatus 100 may record received measurement data and any deviations from expected values, for example even where the deviation is not large enough to trigger an abnormality indication. This data may be used analysed for quality control purposes, for example.

Example Algorithms

Examples of equations and algorithms for use in the computer-implemented simulation process described above are provided below. In this example, the first simulation stage makes use of the following equations:

$$J(x) = \frac{\Delta P}{\mu(R_m + R_g)}, \quad \text{Equation 1}$$

where:
$\Delta P$ is the trans-membrane pressure (TMP) i.e. the difference in pressure across the filter membrane 206
$\mu$ is the viscosity of the feed
$R_m$ is the resistance due to the membrane, which is dependent on the viscosity of the feed and the hydraulic permeability of the membrane.
$R_g$ is the resistance due to the membrane 206, which is dependent on porosity, density and the hydraulic permeability of the gel $$\frac{K(C_m - C)}{C_m R_r L_p} = [\Delta P - (A_1 C_m + A_2 C_m^2 + A_3 C_m^3)] \quad \text{Equation 2}$$

where:
K is a mass transfer coefficient
$C_m$ is the concentration of the feed at the membrane 206 interface
C is the concentration of the bulk of the solution
$L_p$ is the hydraulic permeability of the membrane
$R_r$ is the real retention
$A_1$, $A_2$ and $A_3$ are constants dependent on $R_r$ and which may be determined at least partly on the basis of experimental data.

$$K(x) = \frac{1}{I} \sqrt[3]{\left[\frac{uD^2}{hx}\right]} \quad \text{Equation 3}$$

where:
u is the cross-flow velocity of the feed
D is the relevant diffusion coefficient
I is an integrating factor defined in equation 4 below $$I = \int_0^\infty \exp\left(-\frac{\eta^3}{3} - 0.42\lambda\eta\right)d\eta \quad \text{Equation 4}$$

where:
$\eta$ is a dimensionless variable, given by equation 5
$\lambda$ is given by equation 6

$$\eta = 0.236\left[\frac{\text{Re}^{1.75}Sc}{d_e^2 x}\right]^{1/3} y \quad \text{Equation 5}$$

where:
R is Reynolds number
Sc is the Schmidt number
$d_e$ is the equivalent diameter of the channel $$\lambda = J^*\left(\frac{d_e L}{uD^2}\right)^{\frac{1}{3}} \quad \text{Equation 6}$$

where:
J* is a length average permeate flux given by equation 7.

$$J^* = \frac{1}{L}\int_0^L J(x)dx \quad \text{Equation 7}$$

$$\frac{d(uC)}{dx} = -\frac{JC_p}{h} \quad \text{Equation 8}$$

where:
$C_p$ is a concentration of the permeate.

$$\frac{dC}{dx} = \frac{J}{uh}(C - C_p) \quad \text{Equation 9}$$

In the above equations, values of the following filter characteristics may be provided as input data as described above: $L_p$, L, h. Values of the following process parameters may be provided as input to the simulation, as described above: $\mu$, $R_m$, $R_g$, D, $d_e$. Values of the following parameters (referred to herein as "static process parameters") may be determined according to the algorithm: $\Delta P$, u, C, $C_m$, $C_p$, J, K.

In some examples, the equations set out above are used in an iterative algorithm to determine the static process parameters. For example, a value of f may initially be assigned based on, for example, previous simulations using similar filter characteristics and process parameters, or it may be assigned a random value, for example. A value of J is determined based on equation 7. Based on this a value for K, and subsequently values for $\Delta P$, u, C, $C_m$, $C_p$, J are calculated by solving the other equations numerically, or by another method. The values of J calculated based on equation 7 and the other equations are then compared. If the calculated values of J differ by more than a predetermined amount, for example, if they differ by more than a predetermined proportion e.g. 0.1%, then the process is repeated using a different value of f. The process is thus iterated until the calculated values of J differ by the predetermined amount or less. Once the values of J differ by the predetermined amount or less, the values of J* and the other static process parameters are set for use in the second simulation stage.

The second simulation stage comprises determining time-varying output characteristics of the filtration process, such as concentration and volume of the feed, concentration and volume of the permeate, the trans-membrane pressure etc. vary with time. For example, the second simulation stage may use equations such as equation 10:

$$\frac{dC_f}{dt} = \Delta P * L_p * M_A * \frac{V_f}{C_f} \qquad \text{Equation 10}$$

where
- $c_f$ is the feed concentration
- $V_f$ is the feed volume
- $\Delta P$ is the TMP
- $L_P$ is the hydraulic permeability of the membrane and is given by equation 11 below
- $M_A$ is the molecular weight of the solute.

$$L_P = \frac{L_{p,o(\Delta P - \sigma \Delta \pi_0)}}{\left[(1 - K_a t)^{-4} + K_c v_f V_f\right][\Delta P - \sigma \Delta \pi]} \qquad \text{Equation 11}$$

where:
Lp,o is the initial hydraulic permeability
$\Delta \pi_0$ is the initial osmotic pressure
$\Delta \pi$ is the time varying osmotic pressure
$K_a$ and $K_c$ are constants relating to the cake forming process. Initial values of these constants are assumed. As the dynamic part of the simulation progresses, the values of these constants are updated in order to obtain the best curve fit with the other parameters, thereby simulating the cake forming process and its effect on the filtration process.

Many of the above examples were described with reference to a cross-flow filtration process. However, it will be understood that the invention is equally applicable to other types of filtration process, such as dead end filtration, for example.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

The invention claimed is:

1. A method for selecting a filter for a filtration process, comprising:
    receiving input data, and based thereon identifying one or more filter characteristics for each of a plurality of filter candidates for a filtration process;
    identifying process parameters of the filtration process;
    performing a computer-implemented simulation process of the filtration process for each of the plurality of filter candidates, based on the identified process parameters and identified filter characteristics by using:
        a first simulation stage, comprising determining one or more static process parameters of the filtration process, wherein the one or more static process parameters are determined on the basis of an iterative algorithm; and
        a second simulation stage, comprising determining one or more dynamic characteristics of the filtration process, based on the determined one or more static process parameters;
    determining one or more output characteristics of the filtration process based on the simulation; and
    selecting a filter candidate of the plurality of filter candidates based on the one or more output characteristics.

2. The method according to claim 1, wherein the input data comprises a plurality of respective filter identifiers of the filter candidates, and the method comprises retrieving data from a data store storing associations between filter identifiers and corresponding filter characteristics, thereby identifying the filter characteristics for the plurality of filter candidates.

3. The method according to claim 1, wherein the one or more static process parameters are determined at least partly on the basis of an iterative algorithm.

4. The method according to claim 1, wherein the one or more output characteristics are derived from the determined one or more dynamic characteristics.

5. The method according to claim 1, wherein the selection of the filter candidate is based on a comparison of the determined one or more output characteristics with desired output characteristics.

6. The method according to claim 1, comprising providing an indication of the selected filter candidate.

7. The method according to claim 1, comprising performing one or more further iterations of the computer-implemented simulation process using one or more filter characteristics of the selected filter, including varying process parameters of the filtration process between different iterations, and comparing output characteristics from the different iterations.

8. The method according to claim 7, comprising comparing the output characteristics from the different iterations with desired output characteristics and, based thereon, selecting a set of parameters for the filtration process.

9. The method according to claim 1, wherein the one or more filter characteristics include a geometric characteristics and/or a porosity characteristic.

10. The method according to claim 1, wherein the filtration process parameters include one or more parameters relating to a feed fluid of the filtration process, including one or more of: an initial volume, an initial concentration, a temperature, a solubility and a viscosity.

11. The method according to claim 1, wherein the one or more output characteristics comprises one or more of a product volume, a product composition and a product viscosity.

12. The method according to claim 1, wherein the simulation process comprises a simulation of a solidified solute layer on the filter.

13. The method according to claim 1, wherein the filtration process comprises a cross-flow filtration process.

14. The method according to claim 1, comprising:
    receiving measurement data from a filtration system executing a filtration process corresponding to the simulated filtration process.

15. The method according to claim 14, comprising:
    modifying the simulation based on the measurement data.

16. The method according to claim 14, comprising:
    comparing the measurement data with data from the simulated filtration process; and
    determining whether there is a difference in the filtration process and the simulated filtration process based on the comparison of the measurement data with data from the simulated filtration process, wherein the difference indicates an abnormality in the filtration process.

17. A computer program product configured to execute the method of claim 1.

18. An apparatus comprising at least one processor configured to perform the method of claim 1.

* * * * *